(12) United States Patent
Akhavan et al.

(10) Patent No.: US 10,411,649 B2
(45) Date of Patent: Sep. 10, 2019

(54) LOW-POWER CRYSTAL OSCILLATOR OPERATING IN CLASS B WITH POSITIVE FEEDBACK AND A STEP-DOWN VOLTAGE REGULATOR

(71) Applicant: SPREADTRUM COMMUNICATIONS USA INC., San Diego, CA (US)

(72) Inventors: Aram Akhavan, La Jolla, CA (US); Daniel Ralston, La Jolla, CA (US)

(73) Assignee: SPREADTRUM COMMUNICATIONS USA INC., San Diego, CA (US)

( * ) Notice: Subject to any disclaimer, the term of this patent is extended or adjusted under 35 U.S.C. 154(b) by 136 days.

(21) Appl. No.: 15/448,360

(22) Filed: Mar. 2, 2017

(65) Prior Publication Data

US 2018/0254742 A1    Sep. 6, 2018

(51) Int. Cl.
*H03B 5/36* (2006.01)
*H03L 7/00* (2006.01)

(52) U.S. Cl.
CPC ............. *H03B 5/364* (2013.01); *H03B 5/362* (2013.01); *H03L 7/00* (2013.01); *H03B 2200/0082* (2013.01)

(58) Field of Classification Search
CPC ........ H03B 5/32; H03B 5/1265; H03B 5/364; H03B 2200/005; H03B 5/04; H03B 5/1212; H03B 5/1228; H03B 2200/0082; H03B 5/362; H03L 7/00
USPC .................................... 331/183, 158, 116 FE
See application file for complete search history.

(56) References Cited

U.S. PATENT DOCUMENTS

| | | | |
|---|---|---|---|
| 4,395,774 A | 7/1983 | Rapp | |
| 10,135,390 B2 | 11/2018 | Kumar | |
| 2016/0105187 A1* | 4/2016 | J. ............................ | H03L 7/00 331/36 C |

* cited by examiner

*Primary Examiner* — Arnold M Kinkead
(74) *Attorney, Agent, or Firm* — Kilpatrick Townsend & Stockton LLP

(57) ABSTRACT

A low-power crystal oscillator circuit operating in Class B includes a PMOS transistor, an NMOS transistor, a step-down voltage regulator, and a bias voltage generator. A feedback mechanism includes an inverter whose input is connected to the drains of the PMOS and NMOS transistors and whose output is capacitively coupled to the gate of the PMOS transistor to provide positive feedback.

20 Claims, 2 Drawing Sheets

LOW-POWER CRYSTAL OSCILLATOR OPERATING IN CLASS B WITH POSITIVE FEEDBACK AND A STEP-DOWN VOLTAGE REGULATOR

BACKGROUND

Field of the Disclosure

Aspects of the disclosure relate in general to crystal oscillator circuits. In particular, embodiments include a low-power crystal oscillator circuit operating in Class B with positive feedback and a step-down voltage regulator.

Description of the Related Art

In synchronous digital circuits, a clock signal is a particular type of signal that oscillates between a high and a low state and is utilized like a metronome to coordinate actions of digital circuits.

A clock signal is produced by a clock generator. Although more complex arrangements are used, the most common clock signal is in the form of a square wave with a 50% duty cycle, usually with a fixed, constant frequency. Circuits using the clock signal for synchronization may become active at either the rising edge, falling edge, or, in the case of double data rate, both in the rising and in the falling edges of the clock cycle.

Most integrated circuits (ICs) of sufficient complexity use a clock signal in order to synchronize different parts of the circuit, cycling at a rate less than the worst-case internal propagation delays. In some cases, more than one clock cycle is required to perform a predictable action. As ICs become more complex, the problem of supplying accurate and synchronized clocks to all the circuits becomes increasingly difficult. The preeminent example of such complex chips is the microprocessor, the central component of modern computers, which relies on a clock from a crystal oscillator.

A crystal oscillator is an electronic oscillator circuit that uses the mechanical resonance of a vibrating crystal of piezoelectric material to create an electrical signal with a precise frequency. This frequency is commonly used to keep track of time to provide a stable clock signal for digital integrated circuits, and to stabilize frequencies for radio transmitters and receivers. The most common type of piezoelectric resonator used is the quartz crystal, so oscillator circuits incorporating them became known as crystal oscillators, but other piezoelectric materials including polycrystalline ceramics are used in similar circuits.

Crystal oscillators in RF applications often have an additional low power mode to accommodate "sleep" and "deep sleep" modes. In deep sleep mode, all non-essential circuitry is disabled. During deep sleep, the biasing circuitry is configured in such a way that all currents are reduced by a large factor (e.g. 10), and the voltage swing of the quartz crystal is adjusted to be significantly smaller. These actions substantially reduce the power consumed while still maintaining a stable oscillation. Note that in this mode, the noise level exceeds the requirements for RF frequency generation, but that is acceptable since in sleep and deep sleep modes there is no RF wireless communication. Furthermore, changing the currents and voltage levels slightly shifts the oscillation frequency, which necessarily be corrected for RF systems. This may be accomplished by adjusting a frequency division ratio in the clock generation circuit.

Typical implementations of these sleep modes suffer from higher than optimum power consumption for a number of reasons. First, they use a static current source with a large voltage drop across it; this is wasted power. Second, the bias generator and voltage swing control, which stabilizes oscillation across Process, Voltage, and Temperature (PVT) variations, still consume power. Additionally, the clock generation and buffering circuits continue to consume full power in this mode. In fact, due to the lower crystal voltage swing, these digital circuits can consume more power since they are not driven rail-to-rail. Finally, due to the reduced bias currents, quartz crystals with excessive Equivalent Series Resistance (loss) may not oscillate since the sleep mode cannot provide enough current to overcome the loss.

SUMMARY

Embodiments include a method and apparatus that includes a low-power crystal oscillator circuit operating in Class B with positive feedback and a step-down voltage regulator.

A crystal oscillator circuit, comprising: a switched-capacitor voltage divider, a bias voltage generator, a PMOS transistor, a first resistor, an NMOS transistor, a second resistor, a first inverter, a first capacitor, a second capacitor, a third capacitor, a fourth capacitor, and a second inverter. The bias voltage generator is configured to receive the switched-capacitor voltage divider output having a voltage and to output a bias voltage. The PMOS transistor has a PMOS transistor gate, a PMOS transistor source, and a PMOS transistor drain. The first resistor is serially coupled between the bias voltage generator and the PMOS transistor gate. The NMOS transistor has an NMOS transistor gate, a NMOS transistor source, and a NMOS transistor drain. The NMOS source is connected to ground, and the NMOS transistor drain is connected to: the PMOS transistor drain and an oscillator crystal. The second resistor is serially coupled between the NMOS transistor drain and the NMOS transistor gate. The first inverter is configured to receive input from the NMOS transistor drain and the PMOS transistor drain; the first capacitor configured to output a first inverter output. The first capacitor is serially coupled between the NMOS transistor drain and the NMOS transistor gate. The second capacitor is connected between the NMOS transistor gate and ground. The third capacitor is connected between the NMOS transistor drain and ground. The fourth capacitor is connected between the first inverter output and the PMOS transistor gate. The second inverter is configured to receive the first inverter output, and the second inverter configured to output a second inverter output.

In some embodiments, the crystal oscillator circuit may further comprise a clock generation and buffering circuit configured to receive the second inverter output. The clock generation and buffering circuit is configured to output an output clock signal.

DETAILED DESCRIPTION

Many modern devices, such as mobile phones, rely on an accurate clock signal. Increasingly, such devices are also battery-powered. In order to increase the useful battery life, low power circuits are used.

In mobile phones, for example, cellular transceivers and baseband chipsets have a low power "sleep" mode that is entered during periods of little or no data transfer (e.g. when the phone is locked) in order to save battery life. However, the system must wake up at precise intervals to check for a page, so maintaining an accurate time reference during sleep mode is critical. An accurate time reference is also necessary when the phone is fully off ("deep sleep") so that on power up, the system does not take an excessive amount of time to re-establish contact with the base station. The same clock reference may also be used for radio-frequency (RF) generation to reduce silicon die area, which also reduces the cost of the integrated circuit.

While many conventional clock circuits provide accurate, low power time references, most examples waste power across a current source and in the clock generation block, making them unsuitable for mobile applications.

The present disclosure describes an accurate low-power clock reference, suitable for low voltage applications, robust against high equivalent series resistance (ESR) and easily integrated within a device having suitable noise performance for cellular telephony systems.

Aspects of the present disclosure include a method and apparatus that uses a low-power crystal oscillator circuit operating in Class B with positive feedback and a step-down voltage regulator.

Embodiments include a circuit that uses a crystal oscillator using positive feedback and a step-down voltage regulator, resulting in an accurate, low-power time reference. Other embodiments include mobile phones, cellular transceivers and baseband chipsets that incorporate the low-power crystal oscillator circuit using positive feedback and a step-down voltage regulator.

The embodiments of the disclosure are extremely efficient, using a Class B PMOS device to eliminate current source power waste, and a switched-capacitor voltage divider to efficiently lower the crystal voltage swing and reduce clock generation power. Embodiments are robust due to a positive feedback capacitor. Moreover, embodiments are easily integrated with a low noise solution by reusing an NMOS device and an existing clock generation block. Furthermore, embodiments are very compact, the majority of the area comprised of only two AC coupling capacitors, a single resistor, and two decoupling capacitors which can be implemented as space efficient "super capacitors" (NMOS varactors with stacked metal-on-metal (MOM) capacitors on top).

Figure 1:
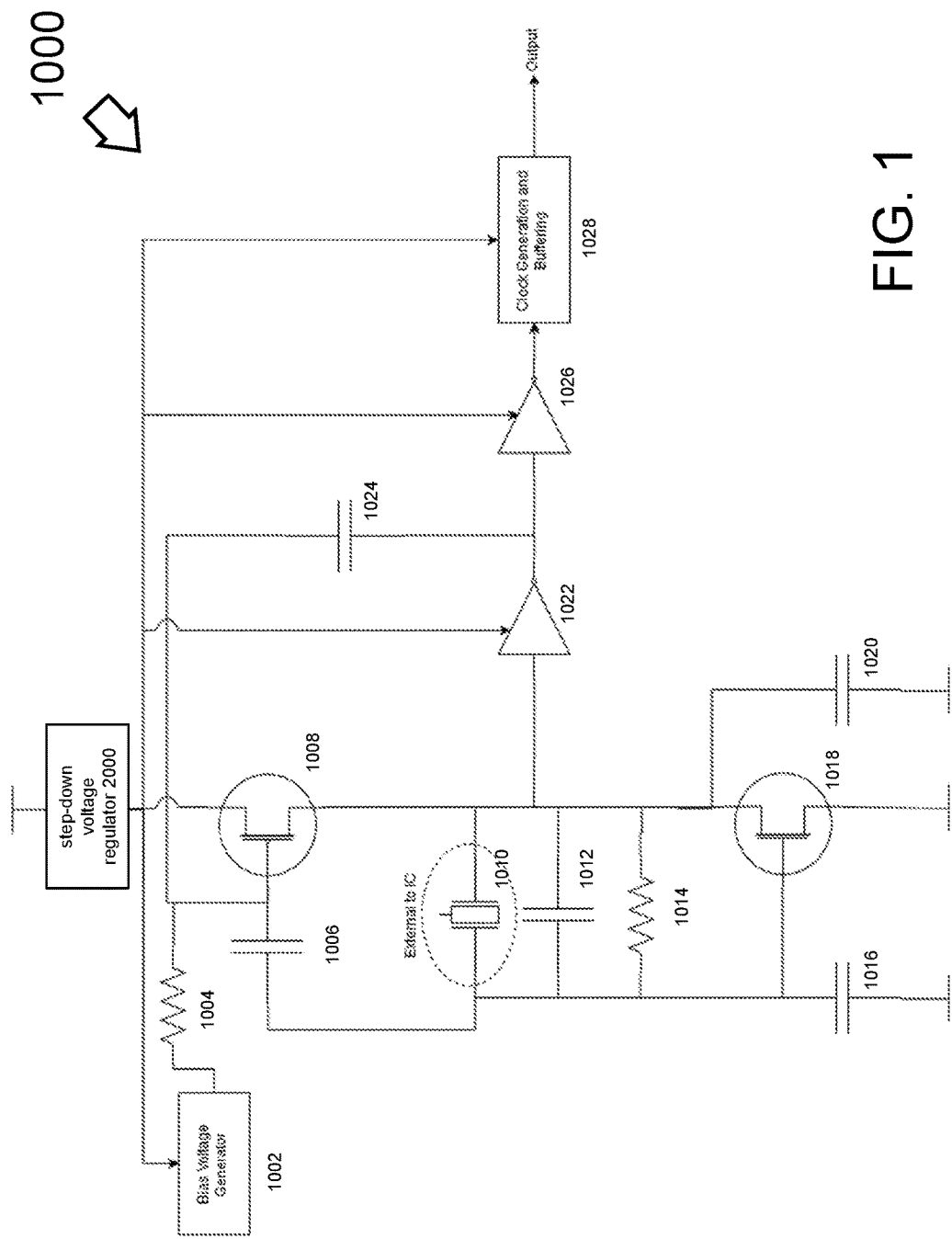
FIG. 1 depicts a low-power crystal oscillator circuit operating in Class B with positive feedback and a step-down voltage regulator.

FIG. 1 depicts a low-power crystal oscillator circuit 1000 that receives positive feedback through a positive feedback capacitor 1024 and is supplied by a step-down voltage regulator 2000, constructed and operative in accordance with an embodiment of the disclosure. An implementation of the step-down voltage regulator 2000 is shown in FIG. 2, also constructed and operative in accordance with an embodiment of the disclosure.

The circuit 1000 described herein may be implemented on an integrated circuit, with an oscillator crystal 1010 located external to the integrated circuit. The oscillator crystal 1010 is a high-Q quartz crystal manufactured to provide an oscillation to a desired frequency, for example 26 MHz. This oscillation frequency must be stable with respect to temperature changes and load capacitance changes relative to other resonant components.

The step-down voltage regulator 2000 is used to generate an output supply voltage, Vout, for a bias voltage generator 1002, inverters 1022, 1026, PMOS transistor 1008, and the clock generation and buffering circuit 1028. The output supply voltage, Vout, is approximately half the power supply, Vin, reducing the relative power consumption of the circuit 1000, especially the clock generation and buffering circuit 1028.

Figure 2:
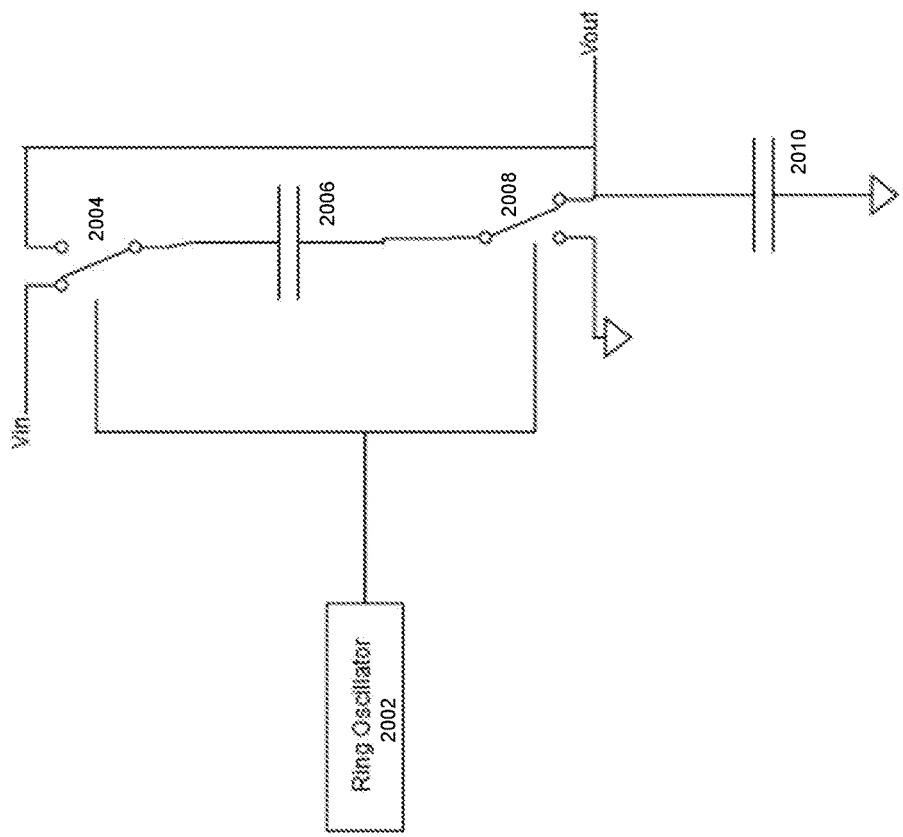
FIG. 2 illustrates a switched-capacitor voltage divider that provides the power supply of the low-power crystal oscillator circuit.

As shown in FIG. 2, the step-down voltage regulator 2000 may comprise two single pole-dual throw switches. It is understood that in some embodiments, single pole-dual throw switches may be implemented as transistors to supply ground and Vout; in some embodiments, single transistors are used, while other embodiments may use transmission gates. In FIG. 2, a low-power integrated ring oscillator 2002 is used as a clock for the step-down voltage regulator 2000. The step-down voltage regulator 2000 includes a first switch 2004 that switches between first capacitor 2006 and Vin and Vout. First capacitor 2006 is connected serially between first switch 2004 and second switch 2008. The second switch 2008 switches between ground, or Vout and a second capacitor 2010 serially connected with ground. This lower supply voltage enables significant power savings, since it allows rail-to-rail (Class B) swing in the oscillator circuit, and lower power consumption in the inverters 1022 and 1026 and clock generation and buffering circuit 1028.

It is understood by those familiar with the art, that alternate embodiments of a step-down voltage regulator 2000 may be used, for example, a buck converter or the like.

Returning to FIG. 1, a bias voltage generator 1002 is serially coupled to a gate of a P-type metal oxide semiconductor (PMOS) transistor 1008 via a first resistor 1004. The bias voltage generator 1002 provides an accurate bias voltage near the turn-on threshold of the PMOS transistor, enabling the Class B operation. The generator tracks and nullifies variations, for example those due temperature shifts, power supply voltage shifts, or manufacturing variability. The PMOS transistor 1008 drain is connected to the drain-side N-type metal oxide semiconductor (NMOS) transistor 1018 and the oscillator crystal 1010, and capacitive coupled ("AC coupled") to the NMOS gate side of the crystal with capacitor 1012, and second resistor 1014. Additionally, the NMOS transistor 1018 drain is connected to a capacitor 1020.

The PMOS transistor 1008 is biased near its threshold. As a result of the bias, during half of a waveform period the PMOS transistor 1008 is completely off. During the other half of the waveform period, the PMOS transistor 1008 pulls the drain node to the supply voltage Vout. Similarly, the NMOS transistor 1018 is biased near its threshold due to the second resistor 1014. During the half of the waveform period where the PMOS transistor 1008 pulls the drain node to Vout, the NMOS transistor 1018 is completely off. During the other half of the waveform period, the NMOS transistor 1018 pulls the drain node to ground. This class B operation, and the fact that the power supply is lowered by the step-down voltage regulator 2000, creates a rail-to-rail voltage swing and prevents "short circuit" current from flowing between the transistors. Operating in this manner eliminates the power that is wasted when a PMOS device is used as a current source as in traditional circuits.

A first inverter 1022 receives its power supply from the step-down voltage regulator 2000, its input from the drains of the two transistors 1008, 1018, and is AC coupled back (via capacitor 1024) to the gate of the PMOS transistor 1008. Because of the two inversions (first inverter 1022 and PMOS transistor 1008), there is a positive feedback loop, which enhances the gain of the circuit 1000. It is understood that other embodiments may use feedback mechanisms other than capacitor 1024 and first inverter 1022. The enhanced gain makes the circuit more robust to temperature and manufacturing variations, and higher loss (ESR) in the quartz crystal 1010. The positive feedback also supports the rail-to-rail voltage swing in the PMOS 1008 and NMOS 1018 gates, which eliminates the "short circuit" current and saves power.

A second inverter 1026 receives its power supply from the step-down voltage regulator 2000, its input from the output of the first inverter 1022, and outputs its signal to a clock generating and buffering circuit 1028, whose power supply is also the step-down voltage regulator 2000. The clock generating and buffering circuit 1028 results in the final output of the circuit, a clock signal which can be at the nominal frequency of the quartz crystal 1010, or some lower frequency generated by a digital clock divider. By using the lower power supply voltage generated by the step-down voltage regulator 2000 for the inverters, clock generation and buffering, substantial power is saved because the power drops with the square of the supply voltage.

The previous description of the embodiments is provided to enable any person skilled in the art to practice the disclosure. Thus, the present disclosure is not intended to be limited to the embodiments shown herein, but is to be accorded the widest scope consistent with the principles and features disclosed herein.

What is claimed is:

1. A crystal oscillator circuit, comprising:
   a step-down voltage regulator coupled to a power supply, the step-down voltage regulator having a step-down voltage lower than the power supply voltage;
   a bias voltage generator configured to receive the step-down voltage and to output a bias voltage;
   a PMOS transistor with a PMOS transistor gate, a PMOS transistor source, and a PMOS transistor drain;
   a first resistor serially coupled between the bias voltage generator and the PMOS transistor gate;
   an NMOS transistor with an NMOS transistor gate, a NMOS transistor source, and a NMOS transistor drain, the NMOS transistor source being connected to ground, and the NMOS transistor drain being connected to the PMOS transistor drain and an oscillator crystal;
   a second resistor serially coupled between the NMOS transistor drain and the NMOS transistor gate;
   a first inverter configured to receive input from the NMOS transistor drain and the PMOS transistor drain, the first inverter configured to output a first inverter output;
   a first capacitor serially coupled between the NMOS transistor drain and the NMOS transistor gate;
   a second capacitor connected between the NMOS transistor gate and ground;
   a third capacitor connected between the NMOS transistor drain and ground;
   a feedback mechanism connected between the PMOS transistor gate and the PMOS and the NMOS transistor drains; and
   a second inverter configured to receive the first inverter output, the second inverter configured to output a second inverter output.

2. The crystal oscillator circuit of claim 1, wherein the circuit further comprises:
   a clock generation and buffering circuit configured to receive the second inverter output and the bias voltage, and the clock generation and buffering circuit configured to output an output clock signal.

3. The crystal oscillator circuit of claim 2, wherein the step-down voltage regulator has a switched-capacitor voltage divider output and comprises:
   a first divider capacitor;
   a first divider switch configured to switch a first terminal of the first divider capacitor between the power supply and the switched-capacitor voltage divider output;
   a second divider switch configured to switch a second terminal of the first divider capacitor between the ground and the switched-capacitor voltage divider output; and
   a ring oscillator configured to act as a clock to control the first divider switch and the second divider switch.

4. The crystal oscillator circuit of claim 3, wherein the switched-capacitor voltage divider comprises:
   a second divider capacitor coupled between the switched-capacitor voltage divider output and ground.

5. The crystal oscillator circuit of claim 4, wherein the bias voltage is for class B operation.

6. The crystal oscillator circuit of claim 5, wherein the feedback mechanism is the first inverter and a fourth capacitor.

7. The crystal oscillator circuit of claim 1, wherein the step-down voltage regulator is a switched-capacitor voltage divider.

8. The crystal oscillator circuit of claim 1, wherein the PMOS transistor source is arranged to receive the power supply voltage.

9. The crystal oscillator circuit of claim 1, wherein the oscillator crystal is connected between the NMOS transistor drain and the NMOS transistor gate.

10. The crystal oscillator circuit of claim 1, wherein the voltage regulator includes a capacitor having a first terminal and a second terminal, and
    wherein the voltage regulator is configured to switch the first terminal of the capacitor between the step-down voltage and the power supply voltage at a clock frequency, and
    wherein the voltage regulator is configured to switch the second terminal of the capacitor between the power supply voltage and ground at the clock frequency.

11. The crystal oscillator circuit of claim 10, wherein the voltage regulator includes:
    a first switch configured to switch the first terminal of the capacitor between the step-down voltage and the power supply voltage at the clock frequency;
    a second switch configured to switch the second terminal of the capacitor between the power supply voltage and ground at the clock frequency; and
    a ring oscillator configured to provide, to the first and second switches, a clock signal having the clock frequency.

12. A crystal oscillator circuit, comprising:
    a step-down voltage regulator configured to receive a power supply voltage, the step-down voltage regulator configured to generate an output supply voltage that is lower than the power supply voltage;
    a bias voltage generator configured to receive the output supply voltage and to output a bias voltage;
    a PMOS transistor with a PMOS transistor gate, a PMOS transistor source, and a PMOS transistor drain;
    a first resistor serially coupled between the bias voltage generator and the PMOS transistor gate;
    an NMOS transistor with an NMOS transistor gate, a NMOS transistor source, and a NMOS transistor drain, the NMOS transistor source being connected to a ground node, and the NMOS transistor drain being connected to the PMOS transistor drain and an oscillator crystal;
    a second resistor serially coupled between the NMOS transistor drain and the NMOS transistor gate;

a feedback mechanism connected between the PMOS transistor gate and the PMOS and the NMOS transistor drains; the feedback mechanism including a first inverter configured to receive input from the NMOS transistor drain and the PMOS transistor drain and to output a first inverter output;

a first decoupling capacitor connected between the NMOS transistor gate and the ground node; and a second decoupling capacitor connected between the NMOS transistor drain and the ground node.

13. The crystal oscillator circuit of claim 12, wherein the step-down voltage regulator is a switched-capacitor voltage divider.

14. The crystal oscillator circuit of claim 12, wherein the PMOS transistor source is arranged to receive the power supply voltage.

15. The crystal oscillator circuit of claim 12, wherein the oscillator crystal is connected between the NMOS transistor drain and the NMOS transistor gate.

16. The crystal oscillator circuit of claim 12, wherein the voltage regulator includes a capacitor having a first terminal and a second terminal, and wherein the voltage regulator is configured to switch the first terminal of the capacitor between the output supply voltage and the power supply voltage at a clock frequency, and wherein the voltage regulator is configured to switch the second terminal of the capacitor between the power supply voltage and the ground node at the clock frequency.

17. The crystal oscillator circuit of claim 16, wherein the voltage regulator includes:

a first switch configured to switch the first terminal of the capacitor between the output supply voltage and the power supply voltage at the clock frequency;

a second switch configured to switch the second terminal of the capacitor between the power supply voltage and the ground node at the clock frequency; and a ring oscillator configured to provide, to the first and second switches, a clock signal having the clock frequency.

18. The crystal oscillator circuit of claim 12, wherein the bias voltage is for class B operation.

19. The crystal oscillator circuit of claim 12, wherein the first inverter output is capacitively coupled to the PMOS transistor gate.

20. The crystal oscillator circuit of claim 12, wherein the first and second decoupling capacitors are implemented as NMOS varactors with stacked metal-on-metal capacitors.

* * * * *